United States Patent
McCune, Jr.

(10) Patent No.: US 7,116,728 B2
(45) Date of Patent: Oct. 3, 2006

(54) QUADRATURE ALIGNMENT IN COMMUNICATIONS RECEIVERS USING DUAL DELAY LINES

(75) Inventor: Earl W. McCune, Jr., Santa Clara, CA (US)

(73) Assignee: Matsushita Electric Industrial Co., Ltd., Cupertino, CA (US)

( * ) Notice: Subject to any disclaimer, the term of this patent is extended or adjusted under 35 U.S.C. 154(b) by 563 days.

(21) Appl. No.: 09/865,409

(22) Filed: May 25, 2001

(65) Prior Publication Data

US 2002/0181619 A1    Dec. 5, 2002

(51) Int. Cl.
*H04L 27/14* (2006.01)
*H04L 27/16* (2006.01)
*H04L 27/22* (2006.01)

(52) U.S. Cl. ............... 375/324; 375/329; 375/346
(58) Field of Classification Search ........... 375/316, 375/327, 330, 322, 329, 346
See application file for complete search history.

(56) References Cited

U.S. PATENT DOCUMENTS

| | | | | |
|---|---|---|---|---|
| 3,748,572 A | | 7/1973 | Kim et al. ............... 323/106 |
| 3,769,580 A | * | 10/1973 | Black ....................... 324/616 |
| 3,800,228 A | * | 3/1974 | Acker ....................... 375/346 |
| 4,475,088 A | * | 10/1984 | Beard ......................... 331/25 |
| 4,492,960 A | * | 1/1985 | Hislop ....................... 342/175 |
| 4,574,244 A | | 3/1986 | Head ............................ 329/50 |
| 4,652,775 A | * | 3/1987 | Daudelin ..................... 327/62 |
| 5,122,879 A | | 6/1992 | Ito .......................... 358/195.1 |
| 5,306,971 A | | 4/1994 | McCune .................... 307/603 |
| 5,578,917 A | * | 11/1996 | Bottman ................. 324/76.15 |
| 5,734,683 A | | 3/1998 | Hulkko et al. ............. 375/316 |
| 5,761,615 A | * | 6/1998 | Jaffee ......................... 455/314 |
| 5,835,850 A | * | 11/1998 | Kumar .................... 455/67.14 |
| 6,198,347 B1 | | 3/2001 | Sander et al. .............. 330/251 |
| 6,317,589 B1 | * | 11/2001 | Nash ....................... 455/245.2 |
| 6,417,715 B1 | * | 7/2002 | Hamamoto et al. ........ 327/291 |

\* cited by examiner

*Primary Examiner*—Temesghen Ghebretinsae
*Assistant Examiner*—Juan Alberto Torres

(57) ABSTRACT

The present invention, generally speaking, takes advantage of the properties of quadrature signals to achieve precise quadrature alignment in a simple fashion. In particular, the expectation of the product of quadrature signals is zero. In accordance with the teachings of the invention, a phase error detection network therefore operates by multiplying the received quadrature signals and low-pass filtering the product to produce an error signal. When the signals are in precise quadrature relationship, the error signal will be zero. Real-time feedback control may be used to drive the error to zero. In accordance with another aspect of the invention, a variable phase shift network is achieved using a dual delay line. The difference in delay between the two delay lines is adjusted in response to the error signal to obtain precise quadrature alignment. The principles of the invention may be applied in connection with traditional mixer architectures or with switch-mode (e.g., "aliased undersampling") architectures.

17 Claims, 3 Drawing Sheets

QUADRATURE ALIGNMENT IN COMMUNICATIONS RECEIVERS USING DUAL DELAY LINES

BACKGROUND OF THE INVENTION

1. Field of the Invention

The present invention relates to communications receivers and more particularly to techniques for generating precise quadrature reference signals for use in the same.

2. State of the Art

Direct conversion receivers are known in the art as exemplified by U.S. Pat. No. 6,061,551, incorporated herein by reference. Such receivers have various advantages over conventional superheterodyne receivers. Regardless of the receiver architecture, however, there is typically a need to generate quadrature reference signals, e.g., a pair of local oscillator (LO) signals phased-shifted by 90°. Both analog and digital techniques have been employed for this purpose. In the case of an analog phase-shift network, because the phase-shift network is narrowband, inaccuracies result at frequencies separated from the nominal design frequency. As data rates and constellation complexity increase, these inaccuracies become a significant impairment. In the case of digital-techniques, an input signal is required that is a frequency multiple of the desired LO frequency. This input signal is frequency divided, typically multiple times. Because of the high switching speeds involved, such circuitry tends to be fairly power hungry.

U.S. Pat. No. 4,475,088, incorporated herein by reference, describes an alternative architecture for achieving quadrature alignment, i.e., for generating a pair of quadrature signals having a precise 90° phase offset. As illustrated in FIG. 1, an RF input signal to be detected is coupled to a first input of first and second quadrature detectors, 10 and 12. A local oscillator 14 provides an RF signal which is divided into two reference signals separated from each other by a phase difference of approximately 90° by a variable phase-shift network 16. These signals are coupled to the second inputs of the quadrature detectors 10 and 12. The output signals of the quadrature detectors 10 and 12 are the conventional I and Q signals associated with quadrature detection systems. The I and Q signals appearing at the outputs of the mixers 10 and 12 are coupled to a phase error detection network 18 implemented, for example, by a digital computer suitably programmed or with analog circuitry. As a result of the calculations performed by the phase error detection network 18, a phase error signal is generated which is used to adjust the variable phase shift network 16 to adjust the phase of the reference signals of the quadrature detectors to reduce the phase error. If the I channel output signal is represented as (A sin x) and the Q channel output signal is represented as (B sin y), then the following equation for the phase error results:

$$\phi(error) = \left[ \frac{A\sin x + B\sin y}{A} - 0.707\frac{B-A}{A} - 1.414 \right]$$

The phase error detection network 18 is based on the foregoing equation. No embodiment of the variable phase shift network is described.

There remains a need for a quadrature alignment technique that is simple in implementation and that achieves precise quadrature alignment.

SUMMARY OF THE INVENTION

The present invention, generally speaking, takes advantage of the properties of quadrature signals to achieve precise quadrature alignment in a simple fashion. In particular, the expectation of the product of quadrature signals is zero. In accordance with the teachings of the invention, a phase error detection network therefore operates by multiplying the received quadrature signals and low-pass filtering the product to produce an error signal. When the signals are in precise quadrature relationship, the error signal will be zero. Real-time feedback control may be used to drive the error to zero. In accordance with another aspect of the invention, a variable phase shift network is achieved using a dual delay line. The difference in delay between the two delay lines is adjusted in response to the error signal to obtain precise quadrature alignment. The principles of the invention may be applied in connection with traditional mixer architectures or with switch-mode (e.g., "aliased undersampling") architectures.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

The present invention takes advantage of the recognition that when I and Q output signals are in quadrature they should be orthogonal, implying the following:

$$E[I(t)Q(t)]=0$$

That is, the expectation (or average value) of the product of I and Q should be zero.

Figure 1:
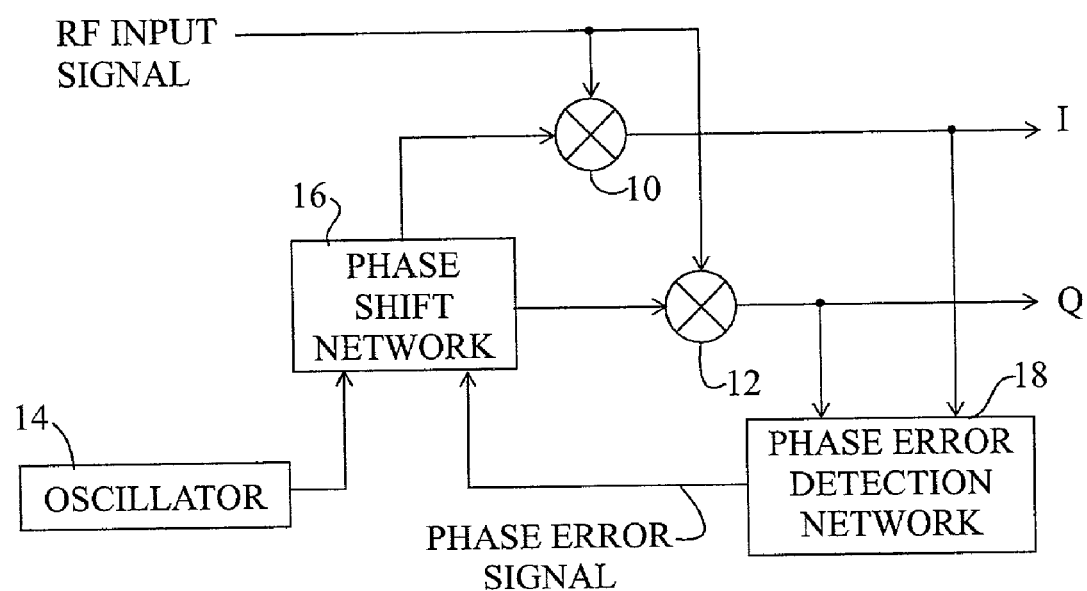
FIG. 1 is a circuit diagram of a known receiver architecture.
Figure 2:
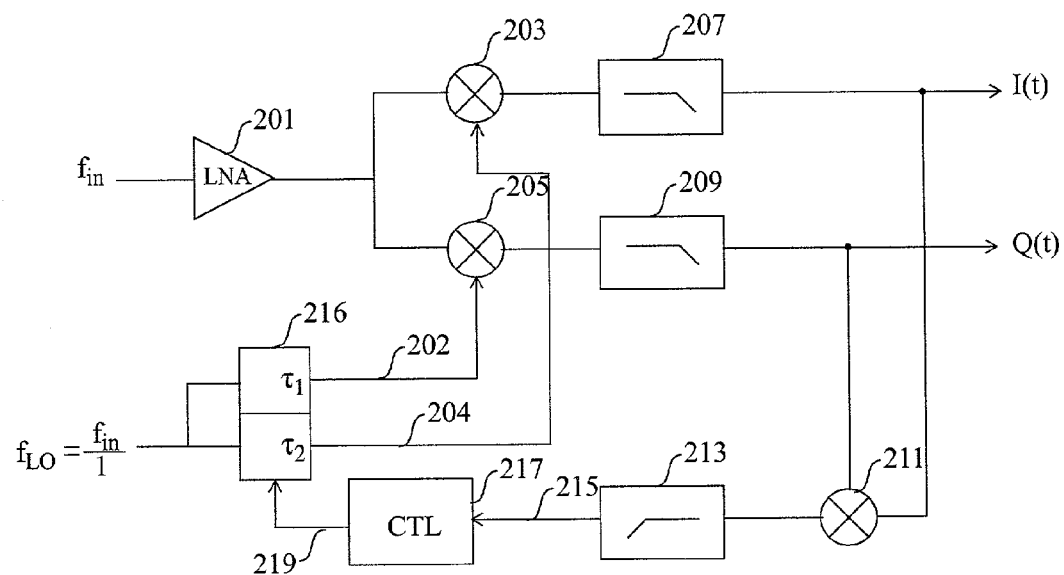
FIG. 2 is a diagram of a receiver in accordance with one embodiment of the invention.

Referring now to FIG. 2, a diagram is shown of a receiver in accordance with one embodiment of the invention. A communications signal having a frequency $f_{in}$ is amplified, e.g. using a low-noise amplifier 201, and is input to respective I and Q mixers 203 and 205. Output signals from the mixers are low-pass filtered using filters 207 and 209 to produce respective I and Q output signals. The received signals I(t) and Q(t) are multiplied using a multiplier 211, and the resulting product is low-pass filtered using a low-pass filter 213 to produce an error signal 215.

Reference signals 202 and 204 for the mixers 203 and 205 are produced using, for example, a dual delay line 216 the delay lines of which exhibit adjustable delays designated as $\tau_1$ and $\tau_2$, respectively. (An example of such a delay line is described in U.S. Pat. No. 5,306,971, incorporated herein by reference.) A local oscillator signal having a frequency designated as $f_{LO}$ is input to both delay lines of the dual delay line. In the illustrated embodiment, because conventional (e.g., Gilbert cell) mixers are used, $f_{LO}=f_{in}$.

The desired quadrature relation exists between the reference signals 202 and 204 when the following relationship is satisfied:

$$\Delta\tau = \tau_1 - \tau_2 = \frac{1}{4f_{in}} = \frac{1}{4f_{LO}} \quad (1)$$

To cause the foregoing relationship to be satisfied, $\tau_1$ is adjusted or $\tau_2$ is adjusted (or both). This adjustment may be a one-time adjustment performed during manufacture. For example, if the delays are relatively stable over temperature and are fixed to exact quadrature for a mid-band frequency of the input signal receive band, then a typical error of approximately 2° will be experienced at the frequency extremes of the receive band—less than the error of most reactive quadrature networks.

Alternatively, the adjustment may be performed in real time. Referring again to FIG. 2, there is shown a controller 217 that receives the error signal 215 and produces a control signal 219 calculated to drive the error signal to zero, the control signal 219 being applied to the dual delay line 216.

Ideally, when the foregoing equation is satisfied, the error signal will be zero. Note however that, depending on the characteristics of other components in the system, the reference signals may have a phase offset different than 90° in order to obtain precise quadrature alignment of the received signals. This property, that the system is forgiving of potential forward-path impairments, results in increased robustness.

Figure 3:
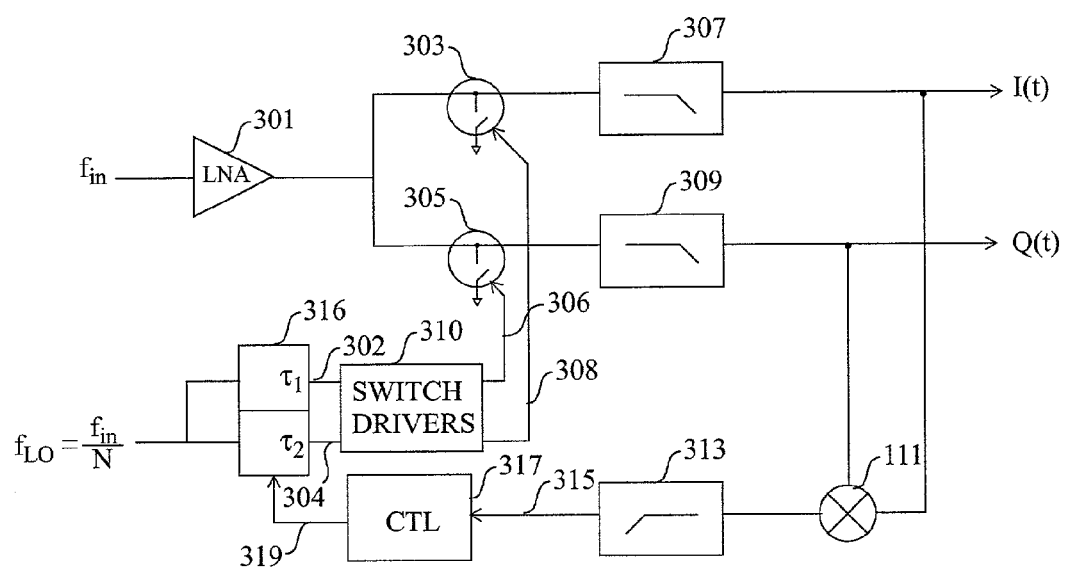
FIG. 3 is a diagram of a receiver in accordance with another embodiment of the invention.

A particularly advantageous arrangement is obtained when the foregoing quadrature alignment technique is applied to a switch-mode receiver architecture as illustrated in FIG. 3. The reference signals 302 and 304, instead of being applied directly to conventional mixers, are applied to switch drivers 310, which produce drive signals 306 and 308 for switches 303 and 305. An alias response of the switches may be used. Hence, in this embodiment, the frequency of the local oscillator may be a sub-harmonic of the frequency of the communications signal to be received; i.e.:

$$f_{LO} = \frac{f_{in}}{N} \quad (2)$$

where N is an integer greater than one. The time differences of equation (1) hold irrespective of the value of N in equation (2). Thus this technique is general for any mixer implementation. Using switching mixers, however, there results a direct-conversion receiver with no on-frequency local oscillator energy and with unusually high tolerance of blocking signals, i.e., signal of large amplitude in the vicinity of the frequency of interest.

More particularly, because switching mixers are passive, 1/f noise is reduced, and depending on the switch drive waveform, an exceedingly high third-order input intercept point can be achieved. With no LO on-channel leakage, there is also avoided on-channel mixing with such leakage signals among themselves, which in conventional direct-conversion receiver architectures leads to DC offset shifts. Mixer conversion loss may be improved by varying the duty cycle of the switch drive signal.

Blocking tolerance come primarily from the high input second and third order input intercept points of the switching mixer. Further tolerance is gained by having the LO at a very different frequency from that of the signal and nearby blocking signals—as is the case with subharmonic operation. Subharmonic operation avoids the complexity of other methods used to genereate on-frequency LO signals from off-frequency oscillators. VCO pulling by input signal magnitude variations is also eliminated by the same techniques.

Figure 4:
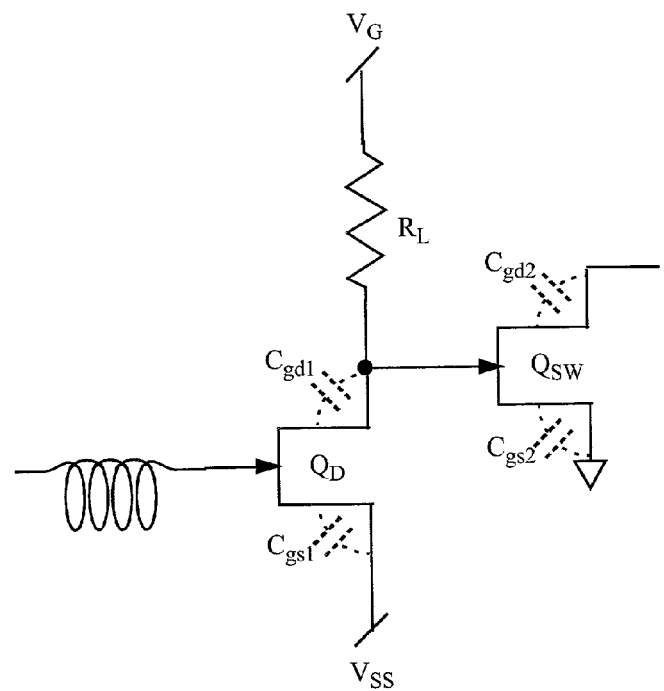
FIG. 4 is a diagram of a switch drive circuit that may be used in the receiver of FIG. 3.
Figure 5:
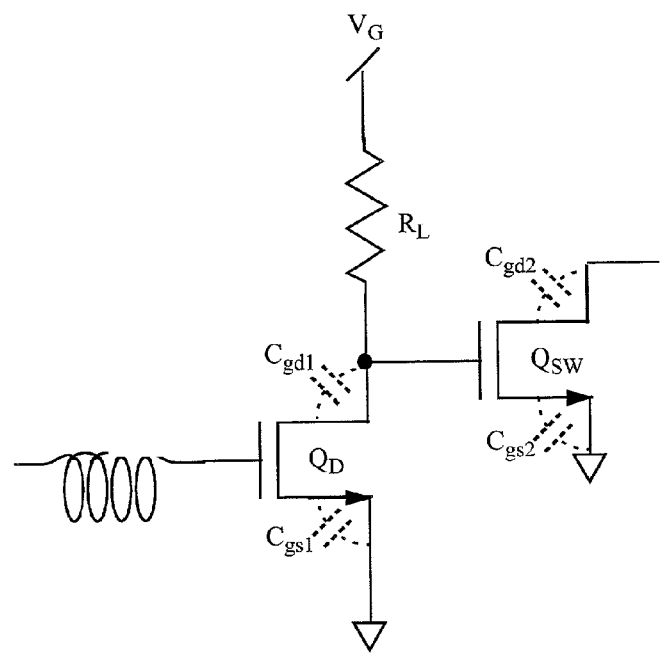
FIG. 5 is a diagram of another switch drive circuit that may be used in the receiver of FIG. 3.

Advantageous switch drive circuits are shown in FIG. 4 and FIG. 5. The principle of these circuits is to drive a power switch with substantially a square wave instead of the usual sine wave. When a sine wave is used, considerable overdrive results, causing forward bias of the gate diode, the inability to resonate the power switch at high frequency, and large leakage of the drive signal into the output signal.

FIG. 4 illustrates a switch drive circuit for a depletion-mode FET such as a MESFET (which has a negative threshold voltage in the vicinity of −3V). A drive transistor $Q_D$ is coupled to drive a switching transistor $Q_{SW}$. The drain of the drive transistor $Q_D$ is coupled to the gate of the switching transistor $Q_{SW}$ and is also coupled through a resistor $R_L$ (i.e., a passive real load) to a voltage $V_G$. The source of the drive transistor is coupled to a voltage $V_{SS}$ more negative than the negative threshold voltage of the switching transistor $Q_{SW}$. The drain of the switching transistor $Q_{SW}$ is coupled (usually through an RF choke) to a supply voltage and to a load device such as an antenna (neither of which are shown).

Because the drive transistor $Q_D$ is much smaller than the switching transistor $Q_{SW}$, the input capacitance $C_{gs1}$ of the drive transistor $Q_D$ can be resonated using a series inductor of practical size. (If, on the other hand, the switching transistor were to be resonated directly, the required inductor would be of such small size as to not be practically realizable.) Furthermore, the input-to-output parasitic coupling capacitance $C_{gd}$ of the drive transistor is sufficiently small that overdriving the drive transistor (using a sine wave) is not a concern.

In operation, as the input of the drive transistor $Q_D$ is resonated, during the positive half-cycle, the drive transistor $Q_D$ is turned on, causing the voltage $V_{SS}$ to be applied to the gate of the switching transistor $Q_{SW}$, abruptly turning it OFF. During the negative half-cycle, the drive transistor $Q_D$ is turned off, causing the voltage $V_G$ to be applied through the resistor $R_L$ to the gate of the switching transistor $Q_{SW}$. The gate voltage rises in accordance with the time constant $\tau = R_L C_{gs2}$, which governs the fall time of the switching transistor $Q_{SW}$, causing the switching transistor $Q_{SW}$ to turn ON.

FIG. 5 illustrates the corresponding circuit for an enhancement-mode FET switch such as an LDMOS transistor. In this instance, when the drive transistor $Q_D$ is turned on, causing the gate of the switching transistor $Q_{SW}$ to be coupled to ground, the switching transistor $Q_{SW}$ is turned off abruptly. The switching transistor $Q_{SW}$ is turned on in accordance with the foregoing time constant when the drive transistor $Q_D$ is turned off, which causes the gate of the switching transistor $Q_{SW}$ to be coupled through the resistor $R_L$ to the voltage $V_G$.

In the case of both circuits, the voltage $V_G$ used to turn on the switching transistor $Q_{SW}$ can be controlled to control drive strength and attendant leakage.

Hence, the foregoing direct drive structure uses a very simple circuit implementation to achieve, simultaneously: minimum rise and fall switching times; minimum drive amplitude and low drive power (improved efficiency) for a desired switch current capability; reduced AM/PM distortion (due to lower feedthrough) and AM/AM distortion (by assuring more "rectangular" signals); and avoidance of gate-source diode forward biasing in MESFETs.

Alternatively, switch drive circuits may be used such as those described in U.S. Pat. No. 6,198,347, incorporated herein by reference.

Although the invention has been described in relation to direct downconversion receiver architectures, the same principles may be applied in conventional heterodyne or super-heterodyne architectures.

Thus, there has been described a quadrature alignment technique for use in communications receivers that is simple in implementation and that achieves precise quadrature alignment. The alignment technique is particularly suitable for direct conversion receiver architectures including switch-mode receiver architectures. The quadrature alignment technique may be used in conjunction with a direct drive structure, for power switching transistors to achieve improved efficiency and low distortion.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of receiving a communications signal to produce two output signals in quadrature relation to one another, comprising:
    deriving two reference signals from a single clock signal using an adjustable dual delay line, the two reference signals being substantially in a quadrature relation to one another, the dual delay line having an error signal input, the dual delay line operable to alter the two reference signals based upon a signal received at the error signal input;
    using the two reference signals, performing frequency downconversion of the communications signal to produce the two output signals;
    forming an error signal representing the expectation of the product of the two output signals;
    propagating said error signal to said error signal input of said dual delay line; and
    using the error signal to adjust said dual delay line in order to alter a relative delay between the two reference signals.

2. The method of claim 1, wherein the dual delay line is adjusted at the time of manufacture.

3. The method of claim 1, wherein the dual delay line is automatically adjusted during operation.

4. A receiver for receiving a communications signal to produce two output signals in quadrature relation to one another, comprising:
    a local oscillator;
    an adjustable phase shift network having a dual delay line, operable to receive an error signal and react in response to said error signal, said dual delay line operable to derive two reference signals, the reference signals being derived from the local oscillator and, at least in part, upon the error signal, the plurality of signals being associated with communication signal components;
    means for, using the plurality of reference signals, performing frequency downconversion of the communications signal to produce the two output signals; and
    a phase error detection network for forming said error signal representing the expectation of the product of the two output signals,
    wherein said dual delay line of said adjustable phase shift network is operable to respond to said error signal and adjust a relative delay between the two reference signals, the delay placing the two reference signals into substantially a quadrature relationship to one another.

5. The apparatus of claim 4, wherein the phase error detection network comprises a multiplier for multiplying the two output signals to form a product signal.

6. The apparatus of claim 5, wherein the phase error detection network comprises a low-pass filter for filtering the product signal to thereby produce the error signal.

7. The apparatus of claim 4, wherein the means for performing frequency downconversion comprises Gilbert-cell mixers.

8. The apparatus of claim 4, wherein the means for performing frequency downconversion comprises switch-mode mixers.

9. The apparatus of claim 8, wherein the frequency of the local oscillator is a sub-harmonic of a frequency of the communications signal.

10. An apparatus, comprising:
    a phase error detection network configured to receive in-phase (I) and quadrature-phase (Q) signals, said phase error detection network including:
    an error signal generator; and
    a dual delay line configured to receive a local oscillator signal and configured to receive an error signal from the error signal generator, the dual delay line operable to generate I and Q reference signals having a relative delay that is dependent on the error signal.

11. The apparatus of claim 10, further comprising a downconverter configured to receive a signal to be downconverted and having reference signal inputs configured to receive the I and Q reference signals.

12. The apparatus of claim 11 wherein the downconverter comprises I and Q mixers.

13. The apparatus of claim 10, further comprising:
    a switch driver configured to receive the I and Q reference signals and generate drive signals; and
    I and Q switches configured to receive I and Q drive signals from said switch driver.

14. The apparatus of claim 13 wherein a frequency of the local oscillator signal is a sub-harmonic of a frequency of the signal to be downconverted.

15. A method of quadrature aligning in-phase and quadrature components of a communications signal, comprising:
    mixing an in-phase (I) component of a communications signal received at an RF input port of an I-channel mixer with an in-phase reference signal received at a reference input of said I-channel mixer;
    mixing a quadrature (Q) component of said communications signal received at an RF input of a Q-channel mixer with a quadrature reference signal received at a reference input of said Q-channel mixer;
    generating an error signal from I-channel and Q-channel outputs of said I-channel and Q-channel mixers;
    providing the error signal to a dual delay line, the dual delay line operable to accept the error signal and an input reference signal, the dual delay line operable to output the in-phase reference signal and the quadrature reference signal; and
    based on a value of the generated error signal, adjusting, with the dual delay line, a relative delay between said in-phase and quadrature reference signals such that said in-phase and quadrature components of said communications signal are substantially in a quadrature relationship.

16. A method of processing a communications signal, the method comprising:
   providing an incoming communications signal;
   providing a reference signal to a dual delay line, the dual delay line having two outputs and operable to output a signal on each output;
   from the reference signal, with the dual delay line, generating an in-phase reference signal and a quadrature reference signal on the two outputs;
   using the incoming communications signal, the in-phase reference signal, and the quadrature reference signal, determining a misalignment between an in-phase channel and a quadrature channel of the communications signal;
   based on the error, generating an error signal associated with the misalignment;
   generating, with the dual delay line and based at least in part on the error signal, a new in-phase component and a new quadrature phase component, the new in-phase component and the new quadrature phase component reflecting changes associated with the error signal.

17. An apparatus for receiving a communications signal, the apparatus comprising:
   means for providing an incoming communications signal;
   a dual delay line having two outputs and operable to generate an in-phase reference signal and a quadrature reference signal, the dual delay line operable to receive a reference signal and a first input, the in-phase reference signal and the quadrature reference signal being based at least in part upon the reference signal and the first input;
   a first downconverter, accepting the communications signal and the in-phase reference signal, and producing a downconverted in-phase component;
   a second downconverter, accepting the communications signal and the quadrature reference signal, and producing a downconverted quadrature component;
   an error determination circuit, coupled to the first and second downconverters, operable to determine a misalignment between the in-phase component and the quadrature component and produce an error signal, the error signal being indicative of any such misalignment, the error determination circuit providing the dual delay line with the error signal as the first input in a feedback loop relationship;
   the dual delay line operable to dynamically adjust the in-phase reference signal and the quadrature reference signal to maintain a substantially quadrature relationship between the in-phase reference signal and the quadrature reference signal.

* * * * *